(12) United States Patent
Delgado et al.

(10) Patent No.: US 9,337,163 B2
(45) Date of Patent: May 10, 2016

(54) LOW PROFILE SURFACE MOUNT PACKAGE WITH ISOLATED TAB

(71) Applicant: General Electric Company, Schenectady, NY (US)

(72) Inventors: Eladio Clemente Delgado, Burnt Hills, NY (US); John Stanley Glaser, Niskayuna, NY (US); Brian Lynn Rowden, Ballston Lake, NY (US)

(73) Assignee: General Electric Company, Schenectady, NY (US)

( * ) Notice: Subject to any disclaimer, the term of this patent is extended or adjusted under 35 U.S.C. 154(b) by 469 days.

(21) Appl. No.: 13/675,084

(22) Filed: Nov. 13, 2012

(65) Prior Publication Data

US 2014/0133104 A1    May 15, 2014

(51) Int. Cl.
*H05K 7/20* (2006.01)
*H01L 23/00* (2006.01)
(Continued)

(52) U.S. Cl.
CPC ............ *H01L 24/19* (2013.01); *H01L 23/3735* (2013.01); *H01L 23/49805* (2013.01); *H01L 23/49844* (2013.01); *H01L 23/49894* (2013.01); *H01L 23/5385* (2013.01); *H01L 23/5389* (2013.01); *H01L 24/06* (2013.01); *H01L 24/24* (2013.01); *H01L 24/29* (2013.01); *H01L 24/32* (2013.01); *H01L 24/73* (2013.01); *H01L 24/82* (2013.01); *H01L 24/83* (2013.01); *H01L 24/92* (2013.01); *H01L 2224/0401* (2013.01); *H01L 2224/04026* (2013.01); *H01L 2224/06181* (2013.01); *H01L 2224/12105* (2013.01); *H01L 2224/24137* (2013.01); *H01L 2224/291* (2013.01); *H01L 2224/32225* (2013.01); *H01L 2224/73267* (2013.01); *H01L 2224/82005* (2013.01); *H01L 2224/82031* (2013.01); *H01L 2224/82039* (2013.01);
(Continued)

(58) Field of Classification Search
CPC ..................... H01L 23/3735; H01L 23/49805; H01L 23/49844; H01L 23/49894; H01L 23/5385; H01L 23/5389; H01L 24/06; H01L 24/19; H01L 24/24; H01L 24/29; H01L 24/32; H01L 24/73; H01L 24/82; H01L 24/83; H01L 24/92
USPC ................................................. 257/703, 705
See application file for complete search history.

(56) References Cited

U.S. PATENT DOCUMENTS

5,637,922 A    6/1997   Fillion et al.
6,306,680 B1   10/2001  Fillion et al.
(Continued)

*Primary Examiner* — Robert Carpenter
(74) *Attorney, Agent, or Firm* — Ziolkowski Patent Solutions Group, SC; Jean K. Testa (57) ABSTRACT

A surface mount package includes at least one semiconductor device and a POL packaging and interconnect system formed about the at least one semiconductor device that is configured enable mounting of the surface mount package to an external circuit. The POL system includes a dielectric layer overlying a first surface of the semiconductor device(s) and a metal interconnect structure extending through vias formed through the dielectric layer so as to be electrically coupled to connection pads on the semiconductor device(s). A metallization layer is formed over the metal interconnect structure that comprises a flat planar structure, and a double-sided ceramic substrate is positioned on a second surface of the semiconductor device(s), with the double-sided ceramic substrate being configured to electrically isolate a drain of the semiconductor device(s) from an external circuit when the surface mount package is joined thereto and to conduct heat away from the semiconductor device(s).

19 Claims, 4 Drawing Sheets

(51) Int. Cl.
*H01L 23/373* (2006.01)
*H01L 23/498* (2006.01)
*H01L 23/538* (2006.01)

(52) U.S. Cl.
CPC ........ *H01L 2224/82047* (2013.01); *H01L 2224/83424* (2013.01); *H01L 2224/83447* (2013.01); *H01L 2224/92144* (2013.01); *H01L 2225/1035* (2013.01); *H01L 2924/10272* (2013.01); *H01L 2924/1203* (2013.01); *H01L 2924/12042* (2013.01); *H01L 2924/1306* (2013.01); *H01L 2924/13091* (2013.01); *H01L 2924/15787* (2013.01); *H01L 2924/351* (2013.01)

(56) References Cited

U.S. PATENT DOCUMENTS

| | | |
|---|---|---|
| 6,994,897 B2 | 2/2006 | Durocher et al. |
| 7,262,444 B2 | 8/2007 | Fillion et al. |
| 2010/0230800 A1* | 9/2010 | Beaupre et al. ............... 257/691 |
| 2011/0266665 A1* | 11/2011 | Gowda et al. ............... 257/691 |

* cited by examiner

LOW PROFILE SURFACE MOUNT PACKAGE WITH ISOLATED TAB

BACKGROUND OF THE INVENTION

Embodiments of the invention relate generally to structures for packaging semiconductor devices and, more particularly, to a semiconductor device package structure that provides a low parasitic inductance, double-sided cooling, and easy mounting to an external circuit.

Power semiconductor devices are semiconductor devices used as switches or rectifiers in power electronic circuits, such as switched mode power supplies, for example. Most power semiconductor devices are only used in commutation mode (i.e., they are either on or off), and are therefore optimized for this. One such power semiconductor device is a high performance, wideband gap silicon carbide (SiC) MOSFET, which has very fast switching transitions and can be used as a power or high frequency device. The SiC MOSFET is able to carry a larger amount of current and typically is able to support a larger reverse-bias voltage in the off-state than other low frequency, low power semiconductor devices, such that SiC MOSFETs are ideal for use in high end military and health care products and other cutting edge technologies.

In use, high voltage power semiconductor devices are typically surface mounted to an external circuit by way of a packaging structure, with the packaging structure providing an electrical connection to the external circuit and also providing a way to remove the heat generated by the devices and protect the devices from the external environment. Most existing packaging structures are only good for low frequency/low power applications due to limitations associated with cooling and inductance drawbacks of such packaging structures. For example, in existing packaging structures, the drain of the semiconductor device(s), such as a MOSFET for example, is connected directly to the back metal tab of the packaging structure, such that the packaging structure is considered to have a "hot tab." Packages with hot tabs are very difficult to provide with a good thermal path in order to cool the semiconductor device(s), since one must electrically insulate the copper lands that interconnect the back side or tab of the package. Furthermore, existing packaging structures use wirebonds to make the connections from the semiconductor device to package pins, with this non-planar wirebond interconnection contributing to an increased inductance of the package. The way the pin-out of the package is configured also contributes to the overall inductance of the package due to the conduction loop that is formed when the pins are soldered to the board—with inherent spacing between the board and the package.

Accordingly there is a need for a semiconductor device package that is suitable for both high frequency and high power applications by providing low inductance interconnections and improved cooling of the semiconductor device(s). There is a further need for such a semiconductor device package to provide for easy surface mounting and attachment of the package to an external circuit while freeing the designer from having to provide voltage isolation while making high current connections to the rest of the circuit.

BRIEF DESCRIPTION OF THE INVENTION

Embodiments of the invention overcome the aforementioned drawbacks by providing a semiconductor device package structure that provides a low parasitic inductance, double-sided cooling, and easy mounting to an external circuit.

In accordance with one aspect of the invention, a surface mount package includes at least one semiconductor device comprising a substrate having a plurality of connection pads formed thereon and a power overly (POL) packaging and interconnect system formed about the at least one semiconductor device and configured to provide for mounting of the surface mount package to an external circuit, with the POL packaging and interconnect system further including a dielectric layer overlying a first surface of the at least one semiconductor device and being joined thereto by way of an adhesive layer, with the dielectric layer and adhesive layer including a plurality of vias formed therethrough. The POL packaging and interconnect system also includes a metal interconnect structure extending through the vias formed through the dielectric layer and adhesive so as to be electrically coupled to the plurality of connection pads of the at least one semiconductor device, a metallization layer formed over the metal interconnect structure and comprising a flat planar structure, and a double-sided ceramic substrate positioned on a second surface of the at least one semiconductor device opposite the first surface, the double-sided ceramic substrate being configured to electrically isolate a drain of the at least one semiconductor device from the external circuit when the surface mount package is joined thereto and being further configured to conduct heat away from the at least one semiconductor device.

In accordance with another aspect of the invention, a surface mount module, having a top surface and a bottom surface configured to be mounted to an external circuit, includes one or more power semiconductor devices and a power overly (POL) packaging and interconnect system formed about the one or more power semiconductor devices that is configured to provide for mounting of the surface mount module to the external circuit. The POL packaging and interconnect system further includes a dielectric layer overlying an active surface of the one or more power semiconductor devices, a metallized interconnect structure formed over the dielectric layer and extending down through openings formed in the dielectric layer so as to be electrically coupled to the one or more power semiconductor devices, and a plurality of connection pads formed on the bottom surface of the surface mount module to provide for connection to the external circuit, the plurality of connection pads comprising wide, flat solderable pads. The POL packaging and interconnect system also includes a double-sided ceramic substrate positioned adjacent the plurality of connection pads, with the double-sided ceramic substrate configured to spatially separate and electrically isolate a floating tab of the one or more power semiconductor devices from the external circuit while conducting heat away from the one or more power semiconductor devices and out of the surface mount module. The metallized interconnect structure, the plurality of connection pads, and the double-sided ceramic substrate form a plurality of planar interconnections for the surface mount module that minimize an inductance of the surface mount module.

In accordance with yet another aspect of the invention, a surface mount package includes one or more power semiconductor devices and a power overly (POL) packaging and interconnect system formed about the one or more power semiconductor devices to provide for mounting of the surface mount package to an external circuit. The POL packaging and interconnect system forms a plurality of planar interconnections between the one or more power semiconductor devices, internal connections of the POL packaging and interconnect system, and the external circuit so as to minimize an inductance of the surface mount module. The POL packaging and interconnect system is configured to electrically isolate a backside drain tab of the one or more power semiconductor devices from the external circuit when the surface mount package is mounted to the external circuit, while conducting heat away from the one or more power semiconductor devices and out of the surface mount package.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Embodiments of the present invention provide for a semiconductor device package having planar interconnections and a floating drain tab to reduce inductance loops in the package and provide a better thermal path to reduce thermal stress to the semiconductor device and the package, while also enabling easier mounting of the package to an external circuit.

Figure 1:
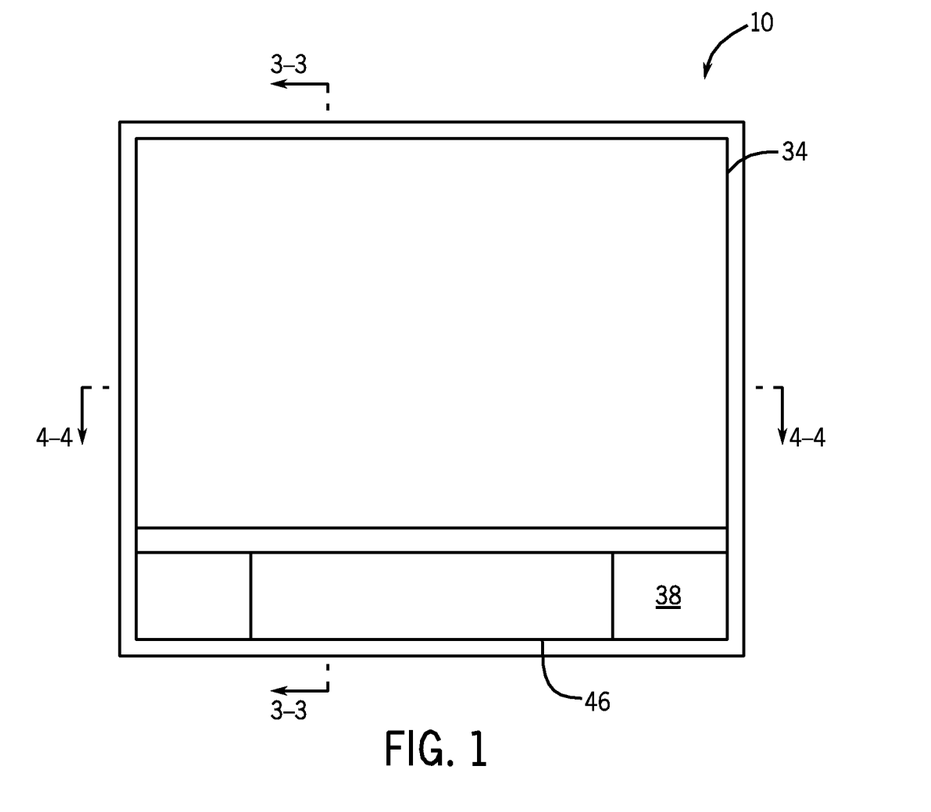
FIG. 1 is a schematic top view a surface mount package according to an embodiment of the invention.

Referring to FIGS. 1-4, various views of a surface mount package or module 10 are shown according to an embodiment of the invention. The surface mount package 10 includes one or more semiconductor device(s) 12 therein comprising a substrate 13 having a plurality of connection pads 30 formed thereon and that, according to various embodiments, may be in the form of transistors, dies, diodes, or other power electronic devices. As shown in FIG. 1, a silicon carbide (SiC) MOSFET 14 and two SiC diodes 16 are provided in surface mount package 10, however, it is recognized that a greater or lesser number of semiconductor devices 12 could be included in surface mount package 10. In an exemplary embodiment, the number of semiconductor devices 12 included in surface mount package 10 is such that the package is considered a "low count" module. As further shown in the embodiment, a shim 18 is also provided that is used like the semiconductor devices 12. The shim 18 may be made of copper or a similar material that is used as an electrical short, or may be made from a ceramic like Alumina or aluminum nitride this is used to provide mechanical support or act as a thermal conduit in the surface mount package.

Figure 3:
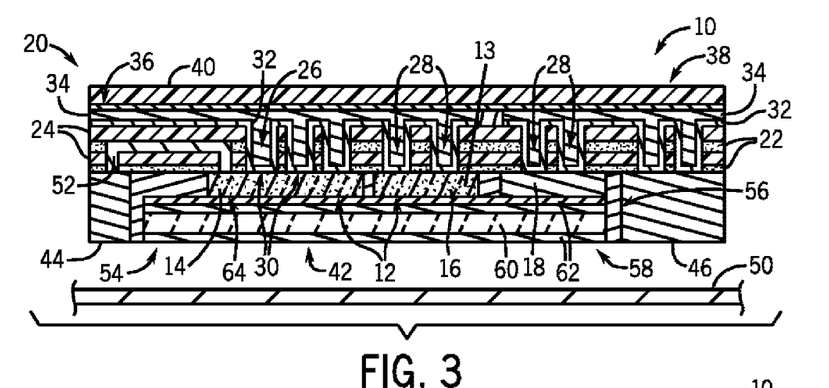
FIG. 3 is a schematic cross-sectional side view of the surface mount package of FIG. 1 taken along line 3-3.
Figure 4:
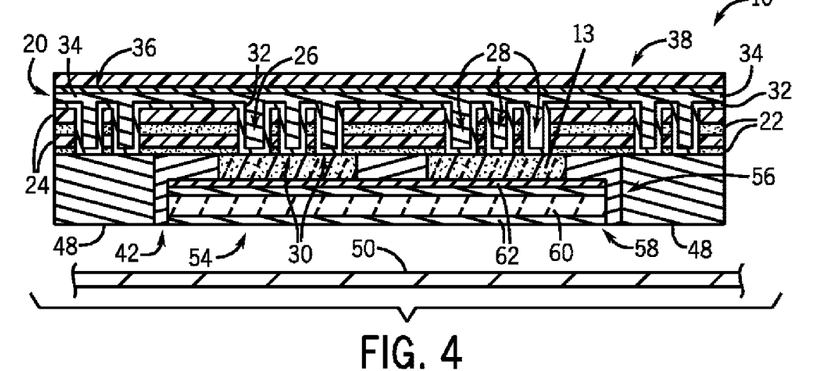
FIG. 4 is a schematic cross-sectional side view of the surface mount package of FIG. 1 taken along line 4-4.

The semiconductor device(s) 12 are packaged using a power overlay (POL) packaging and interconnect system 20 that implements rugged and reliable metallurgical connections and interconnects that are configured to reduce contact resistance and therefore reduce voltage and conduction losses in the surface mount package, such that the POL system 20 is well suited for use in high frequency and high power applications. The POL system 20 provides planar interconnections between the semiconductor devices, the internal connections of the package, and the external board connections, with wide copper strips/pads and metallurgical connections/vias to the contact pads on the semiconductor devices 12 being used to make the connections. The POL system 20 provides better thermal performance at a higher current capacity, especially during transient current spikes, than the interconnect systems of the prior art, such as wire bonding and flip chip interconnect techniques. The POL system 20 also presents a relatively low parasitic inductance and low electromigration tendencies. As shown in FIGS. 3 and 4, the POL system 20 provides for a low profile, planar interconnect structure in surface mount package 10.

As shown in FIGS. 3 and 4, in packaging the semiconductor device(s) 12 using POL technology, one or more adhesive layers 22 and dielectric layers 24 (e.g., dielectric lamination or film) are provided for attachment to a first surface 26 (i.e., active surface) of semiconductor device(s) 12. In performing such an attachment, a dielectric layer 24 is first applied onto a frame structure (not shown), with an adhesive layer 22 then deposited onto dielectric layer 24 to accommodate subsequent placement of the semiconductor device(s) 12 thereon. The dielectric layer 24 is in the form of a lamination or film and is placed on the frame structure to provide stability during the application of adhesive layer 22 (and a backing/release sheet, not shown) and during a subsequent formation of vias 28 through the adhesive layers 22 and dielectric laminations 24, with such vias 28 being formed by way of a laser ablation or laser drilling process, plasma etching, photo-definition, or mechanical drilling process, for example, and being formed to align with connection pads 30 of semiconductor devices 12. According to embodiments of the invention, the dielectric layer 24 may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material.

The POL system 20 includes metal interconnects 32 and a metallization layer 34 (i.e., top copper layer) that are formed down into vias 28 and overlying a topmost dielectric layer 24. The metal interconnects 32 are typically formed through a combination of sputtering and electroplating applications, although it is recognized that other electroless methods of metal deposition could also be used. For example, a titanium adhesion layer and copper seed layer may first be applied via a sputtering process, followed by an electroplating process that increases a thickness of the copper to a desired level. The applied metal material is then subsequently patterned into metal interconnects 32 having a desired shape and that function as vertical feed-throughs formed through dielectric layers 24 and adhesive layers 22. As shown in FIGS. 3 and 4, according to one embodiment, metal interconnects 32 form direct metallic and electrical connections to connection pads 30 on semiconductor devices 12.

The metallization layer 34, in combination with metal interconnects 32, provides for heat flow out from the semiconductor devices 12 of surface mount package 10, as heat flows from the semiconductor devices 12 through the conductive metal interconnects 32 formed in vias 28 and out to the top metallization layer 34. As shown in FIGS. 3 and 4, the metallization layer 34 is constructed such that an outward facing surface 36 thereof has a flat top geometry. This planar geometry of the outward surface 36 enables the surface mount package 10 to be cooled from two sides, as a contact cooler (not shown) having a high thermal conductivity (e.g., copper, aluminum or a composite material heat sink) may be added to a top surface 38 of surface mount package 10. According to one embodiment of the invention, and as shown in FIGS. 3 and 4, a dielectric top layer 40 is applied over metallization layer 34 to form the top surface 38 of surface mount package 10, with the contact cooler being positioned adjacent to (in contact with) dielectric top layer 40 so as to provide for cooling at the top surface 38 of surface mount package 10.

Figure 2:
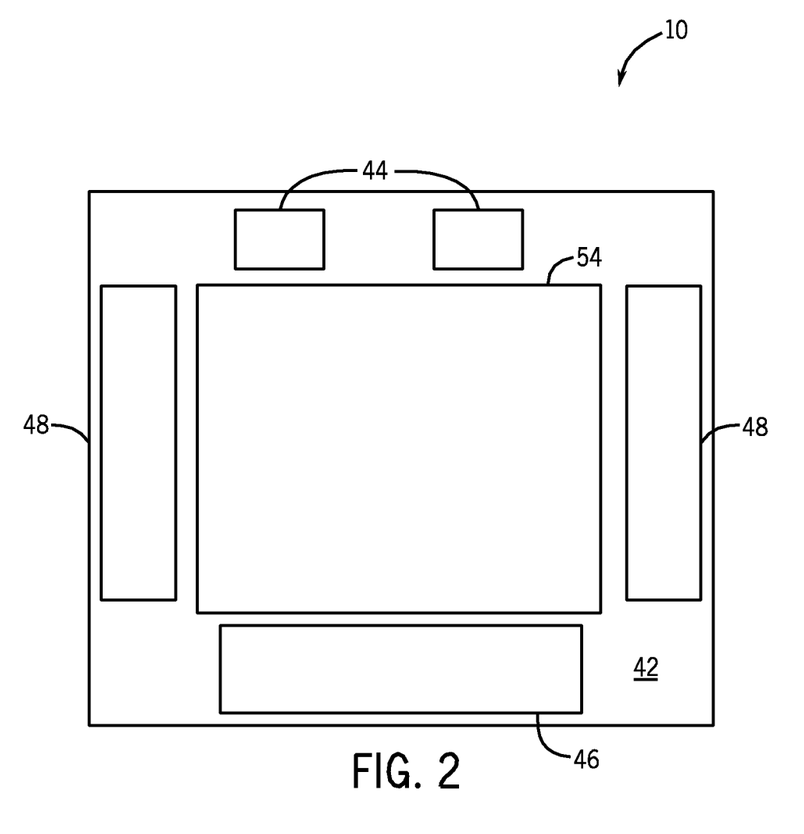
FIG. 2 is a schematic bottom view of the surface mount package of FIG. 1.

Referring now to FIGS. 2-4, a bottom surface 42 of surface mount package 10 is shown as including gate, drain, and source connections (i.e., "tabs") 44, 46, 48 to connect the semiconductor devices 12 in surface mount package 10 to an external board or circuit carrier 50. Each of the gate connections 44, drain connection 46, and source connection 48 are constructed as wide pads that are tightly configured around the surface mount module 10 to help reduce unwanted electrical loops. The connections 44, 46, 48 enable a very tight planar electrical connection to be made from the circuit board 50 to internal planes of the surface mount package 10, with very short paths thus being formed from the circuit board 50 to the internal planes so as to reduce parasitic inductance in the surface mount package 10. The connections 44, 46, 48 serve as connection points that allow for soldering of the surface mount package 10 to the board or circuit carrier 50. As shown in FIGS. 3 and 4, the drain connection 46 and source connection 48 are electrically connected to the metal interconnects 32 of POL system 20 that extend down through the vias 28 formed in dielectric layers 24 and adhesive layers 22. The gate connection 44 is electrically coupled to SiC MOSFET 14 by way of a gate lead 52.

A double-sided ceramic substrate 54 is also provided in surface mount package 10 and forms part of the bottom surface 42 of the surface mount package 10. The SiC MOSFET 14 and two SiC diodes 16 are soldered to a top surface 56 of the double-sided ceramic substrate 54, while a bottom surface 58 of the double-sided ceramic substrate 54 is left fully or partially exposed to provide efficient heat transfer out from the surface mount package 10 and provide for soldering of the surface mount package 10 to the external board/circuit carrier 50.

According to one embodiment, the double-sided ceramic substrate 54 is constructed as a direct bond copper (DBC) structure that is composed of a ceramic tile (e.g., alumina) 60 with a sheet of copper 62 bonded to both sides thereof by a direct bond joining process (i.e., copper pattern on die side of ceramic tile and balancing copper on non-die side). However, while the double-sided ceramic substrate 54 is referred to above and here below as a "DBC structure 54," it is recognized that the double-sided ceramic substrate 54 may be constructed of other materials, with aluminum being used instead of copper as the metal layer for example, and thus such an embodiment is considered within the scope of the invention. Thus, use of the term "DBC structure" here below is meant to encompass a double-sided ceramic substrate 54 that includes a ceramic tile (e.g., alumina) with a sheet of any suitable metallic material (such as copper or aluminum) bonded to both sides thereof via any high temperature joining process, including brazing or direct bonding technology. Alternatively, it is recognized that other similar structures could also be employed, such as an insulated metal substrate (IMS) structure, for example, that provides electrical insulation—but not ideal thermal conductivity, and thus may require thermal pathways formed therethrough.

The inclusion of DBC structure 54 in surface mount package 10 serves to electrically isolate/insulate a bottom drain surface 64 of SiC MOSFET 14 from the external circuit 50, while still providing an improved thermal pathway to conduct heat away from the drain 64 of the MOSFET. The DBC structure 54 configures the SiC MOSFET backside drain 64 as a "floating tab" that is physically separated from the external circuit 50. This floating tab configuration that is achieved by inclusion of DBC structure 54 in surface mount package 10 makes it easier to board mount the surface mount package 10 and frees the designer from having to provide voltage isolation while making high current connections to the rest of the circuit. The DBC structure 54, in conjunction with connections 44, 46, 48, provides a planar bottom surface on surface mount package 10, allowing for easy mounting and attachment of the surface mount package 10 to the circuit board 50 at the same time other surface mount components are attached during solder re-flow Referring now to FIG. 5, a surface mount package 70 is shown according to another embodiment of the invention, where extra cooling of the semiconductor devices 12 in the surface mount package is required/desired. The surface mount package 70 functions similarly to the surface mount package 10 shown in FIGS. 1-4; however, the construction of surface mount package 70 differs slightly from that of surface mount package 10. Specifically, surface mount package 70 is configured such that a top surface double-sided ceramic substrate 72 is provided on the top surface 74 of surface mount package 70 to reduce the thermal resistance of the heat path through the top of the package. The top side dielectric layer 40 (e.g., Kapton layer) of surface mount package 10 (FIG. 1) is replaced by the double-sided ceramic substrate 72 (e.g., a copper-ceramic-copper DBC structure) having a lower thermal resistance than the dielectric layer, with the double-sided ceramic substrate 72 being soldered to the copper metallization layer 34, according to one embodiment. A top side heat sink or other contact cooler (not shown) may then be added to double-sided ceramic substrate 72 and thermally connected thereto, while being electrically insulated from the surface mount package 10 by way of the double-sided ceramic substrate 72. More efficient double-sided cooling of semiconductor devices 12 may thus be achieved by implementation of the surface mount package structure shown in FIG. 5.

Figure 5:
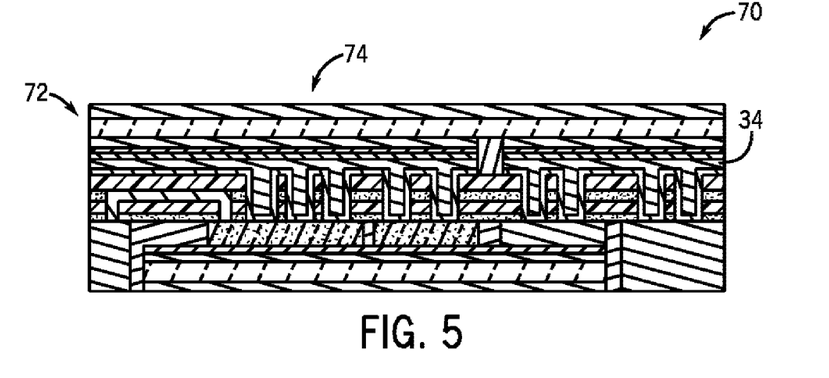
FIG. 5 is a schematic cross-sectional side view of a semiconductor device package according to another embodiment of the invention.

According to another embodiment of the invention, it is recognized that surface mount package 70 of FIG. 5 could be configured as a "flip-chip" type module that provides for soldering of the top surface 74 of the package to an external board or circuit carrier. That is, the inclusion of top surface double-sided ceramic substrate 72 on the top surface 74 of surface mount package 70 provides flip-chip package functionality to the surface mount package 70 by presenting a planar top surface 74 that can be soldered to a circuit carrier. In an embodiment where the surface mount package 70 of FIG. 5 is implemented as a flip-chip type module and the top surface 74 is soldered to a circuit carrier, it is recognized that the copper tabs 44, 46, 48 would be provided on the top surface 74 of surface mount package 70 rather than on the bottom surface of the package (as is currently illustrated in FIG. 5), such that the tabs and the top surface double-sided ceramic substrate 72 combine to present a planar surface.

Figure 6:
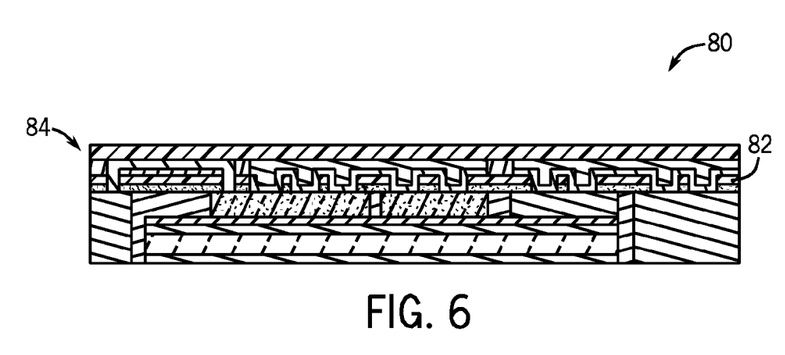
FIG. 6 is a schematic cross-sectional side view of a semiconductor device package according to another embodiment of the invention.

Referring now to FIG. 6, an additional surface mount package 80 is illustrated according to an embodiment of the invention. Again, the surface mount package 80 functions similarly to the surface mount packages 10, 70 shown in FIGS. 1-4 and FIG. 5; however, the construction of surface mount package 80 differs slightly therefrom. As shown in FIG. 6, a surface mount package 80 is illustrated where a single dielectric layer 82 is provided as part of a POL system 84. The inclusion of only a single dielectric layer 82 serves to further minimize a thickness of the surface mount package 80, with it being recognize that a trade-off occurs between such minimizing of package thickness and an increase in a current density in the POL system 84 resulting from the inclusion of only a single dielectric layer 82.

Beneficially, embodiments of the invention thus provide a surface mount package having planar interconnections and a floating drain tab to reduce inductance loops in the package and provide a better thermal path to reduce thermal stress to the semiconductor device(s) and the package, while also enabling easier mounting of the package to an external circuit. The floating tab in the planar package makes it easier to board mount the package and frees the designer from having to provide voltage isolation while making high current connections to the rest of the external circuit. The floating tab also allows the designer to implement a much better thermal path and/or better cooling for the semiconductor or semiconductor devices inside the package. Additionally, as the planar package includes robust direct metallic connections instead of wire bonds and further includes a flat top geometry that makes the package capable of being double sided cooled, the thermal stresses on the package are reduced. In surface mount packages where extra cooling is desired, such cooling is realized by having materials added to the package in such a way as to provide a thermal path from the top of the device to a top side cooler. Embodiments of the invention also beneficially provide a surface mount package that having low inductance resulting from the planar interconnections included therein between the semiconductor chips, the internal connections of the package, and the board connections. All connections are planar and use wide copper strips/pads to make the connections. The use of such copper connections and the copper vias implemented by the POL technology, which can mimic passivation openings on the semiconductor die, all work together to reduce contact resistance and therefore reduce voltage and conduction losses. Furthermore, the POL connections are true metallurgical connections to the semiconductor pads and thus are more rugged and reliable than wire bonds which are thin ultrasonic placed aluminum or gold wires. Overall this makes this package viable for high frequency along with power applications.

Therefore, according to one embodiment of the invention, a surface mount package includes at least one semiconductor device comprising a substrate having a plurality of connection pads formed thereon and a power overly (POL) packaging and interconnect system formed about the at least one semiconductor device and configured to provide for mounting of the surface mount package to an external circuit, with the POL packaging and interconnect system further including a dielectric layer overlying a first surface of the at least one semiconductor device and being joined thereto by way of an adhesive layer, with the dielectric layer and adhesive layer including a plurality of vias formed therethrough. The POL packaging and interconnect system also includes a metal interconnect structure extending through the vias formed through the dielectric layer and adhesive so as to be electrically coupled to the plurality of connection pads of the at least one semiconductor device, a metallization layer formed over the metal interconnect structure and comprising a flat planar structure, and a double-sided ceramic substrate positioned on a second surface of the at least one semiconductor device opposite the first surface, the double-sided ceramic substrate being configured to electrically isolate a drain of the at least one semiconductor device from the external circuit when the surface mount package is joined thereto and being further configured to conduct heat away from the at least one semiconductor device.

According to another embodiment of the invention, a surface mount module, having a top surface and a bottom surface configured to be mounted to an external circuit, includes one or more power semiconductor devices and a power overly (POL) packaging and interconnect system formed about the one or more power semiconductor devices that is configured to provide for mounting of the surface mount module to the external circuit. The POL packaging and interconnect system further includes a dielectric layer overlying an active surface of the one or more power semiconductor devices, a metallized interconnect structure formed over the dielectric layer and extending down through openings formed in the dielectric layer so as to be electrically coupled to the one or more power semiconductor devices, and a plurality of connection pads formed on the bottom surface of the surface mount module to provide for connection to the external circuit, the plurality of connection pads comprising wide, flat solderable pads. The POL packaging and interconnect system also includes a double-sided ceramic substrate positioned adjacent the plurality of connection pads, with the double-sided ceramic substrate configured to spatially separate and electrically isolate a floating tab of the one or more power semiconductor devices from the external circuit while conducting heat away from the one or more power semiconductor devices and out of the surface mount module. The metallized interconnect structure, the plurality of connection pads, and the double-sided ceramic substrate form a plurality of planar interconnections for the surface mount module that minimize an inductance of the surface mount module.

According to yet another embodiment of the invention, a surface mount package includes one or more power semiconductor devices and a power overly (POL) packaging and interconnect system formed about the one or more power semiconductor devices to provide for mounting of the surface mount package to an external circuit. The POL packaging and interconnect system forms a plurality of planar interconnections between the one or more power semiconductor devices, internal connections of the POL packaging and interconnect system, and the external circuit so as to minimize an inductance of the surface mount module. The POL packaging and interconnect system is configured to electrically isolate a backside drain tab of the one or more power semiconductor devices from the external circuit when the surface mount package is mounted to the external circuit, while conducting heat away from the one or more power semiconductor devices and out of the surface mount package.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A surface mount package comprising:
    at least one semiconductor device, each of the at least one semiconductor devices comprising a substrate having a plurality of connection pads formed thereon; and
    a packaging and interconnect system that packages the at least one semiconductor device and is configured to provide for mounting of the surface mount package to an external circuit, the packaging and interconnect system comprising:

a dielectric layer overlying a first surface of the at least one semiconductor device, the dielectric layer including a plurality of vias formed therethrough;

a metal interconnect structure extending through the vias formed through the dielectric layer so as to be electrically coupled to the plurality of connection pads of the at least one semiconductor device;

a metallization layer formed over the metal interconnect structure, the metallization layer comprising a flat, planar structure;

gate, source, and drain connection tabs configured to provide for connection of the surface mount package to the external circuit; and a double-sided ceramic substrate positioned on a second surface of the at least one semiconductor device opposite the first surface, the double-sided ceramic substrate being configured to electrically isolate a backside drain of the at least one semiconductor device from the external circuit when the surface mount package is joined thereto and being further configured to conduct heat away from the at least one semiconductor device;

wherein the packaging and interconnect system comprises a top surface and a bottom surface, with the bottom surface comprising a planar surface that is mountable to the external circuit; and wherein the double-sided ceramic substrate forms a first portion of the planar bottom surface of the packaging and interconnect system and the gate, source, and drain connection tabs form a second portion of the planar bottom surface of the packaging and interconnect system.

2. The surface mount package of claim 1 wherein the gate, source and drain connection tabs comprise solder pads.

3. The surface mount package of claim 2 wherein the gate, source and drain connection tabs, in combination with the double-sided ceramic substrate, form the planar bottom surface of the surface mount package.

4. The surface mount package of claim 1 wherein the gate, source and drain connection tabs are electrically coupled to the metal interconnect structure and the at least one semiconductor device.

5. The surface mount package of claim 1 wherein the packaging and interconnect system further comprises one of:
a dielectric top layer applied over the metallization layer; or a top surface double-sided ceramic substrate applied over the metallization layer.

6. The surface mount package of claim 5 wherein the one of the dielectric top layer and the top surface double-sided ceramic substrate are configured to present a flat top surface for the surface mount package to accommodate attachment of a contact cooler thereto, thereby providing for double-sided cooling of the surface mount package.

7. The surface mount package of claim 1 wherein the double-sided ceramic substrate comprises a direct bond copper (DBC) structure including a ceramic insulating tile having a copper sheet applied on each of top and bottom surfaces thereof.

8. The surface mount package of claim 1 wherein the at least one semiconductor device comprises a power semiconductor device.

9. The surface mount package of claim 8 wherein the at least one semiconductor device comprises at least one of a silicon carbide (SiC) MOSFET and a SiC diode.

10. The surface mount package of claim 1 wherein the packaging and interconnect system is configured to provide planar connections in and to the surface mount package to reduce inductance loops in the surface mount package.

11. A surface mount module including a top surface and a bottom surface configured to be mounted to an external circuit, the surface mount module comprising:
one or more power semiconductor devices; and
a power overly (POL) packaging and interconnect system surrounding the one or more power semiconductor devices and configured to provide for mounting of the surface mount module to the external circuit, the POL packaging and interconnect system comprising:
a dielectric layer overlying an active surface of the one or more power semiconductor devices;
a metallized interconnect structure formed over the dielectric layer and extending down through openings formed in the dielectric layer so as to be electrically coupled to the one or more power semiconductor devices;
a plurality of connection tabs formed on the bottom surface of the surface mount module to provide for connection to the external circuit, the plurality of connection tabs comprising flat, solderable pads; and
a double-sided ceramic substrate positioned adjacent the plurality of connection tabs, the double-sided ceramic substrate configured to spatially separate and electrically isolate a backside drain of the one or more power semiconductor devices from the external circuit, while conducting heat away from the one or more power semiconductor devices and out of the surface mount module;
wherein the metallized interconnect structure, the plurality of connection tabs, and the double-sided ceramic substrate form a plurality of planar interconnections for the surface mount module, the plurality of planar interconnections comprising a planar top surface of the surface mount module and a planar bottom surface of the surface mount module.

12. The surface mount module of claim 11 wherein the plurality of connection tabs comprises gate, source, and drain connection tabs that, in combination with the double-sided ceramic substrate, form the planar bottom surface of the surface mount module.

13. The surface mount module of claim 11 wherein the metallized interconnect structure comprises the planar top surface configured to accommodate attachment of a contact cooler to the surface mount module.

14. The surface mount module of claim 11 wherein the POL packaging and interconnect system further comprises one of a dielectric top layer and a top surface double-sided ceramic substrate applied over the metallized interconnect structure.

15. The surface mount module of claim 11 wherein the double-sided ceramic substrate comprises a direct bond copper (DBC) structure including:
a ceramic tile; and
a copper sheet attached to each side of opposing sides of the ceramic tile.

16. A surface mount package comprising:
one or more power semiconductor devices; and
a power overly (POL) packaging and interconnect system surrounding the one or more power semiconductor devices to provide for mounting of the surface mount package to an external circuit;
wherein the POL packaging and interconnect system forms a plurality of planar interconnections between the one or more power semiconductor devices, internal connections of the POL packaging and interconnect system, and the external circuit, the plurality of planar interconnections comprising a planar first surface of the surface mount package and a planar second surface of the surface mount package; and wherein the POL packaging and interconnect system is configured to electrically isolate a backside drain of the one or more power semiconductor devices from the external circuit when the surface mount package is mounted to the external circuit, while conducting heat away from the one or more power semiconductor devices and out of the surface mount package.

17. The surface mount package of claim 16 wherein the POL packaging and interconnect system comprises:
  a dielectric layer overlying a first surface of the one or more power semiconductor devices and being joined thereto by way of an adhesive layer, the dielectric layer and adhesive layer including a plurality of vias formed therethrough;
  a metal interconnect structure extending through the vias formed through the dielectric layer and adhesive so as to be electrically coupled to the plurality of connection pads of the one or more power semiconductor devices;
  a metallization layer formed over the metal interconnect structure, the metallization layer comprising a flat, planar structure; and
  a double-sided ceramic substrate positioned on a second surface of the at least one semiconductor device opposite the first surface, the double-sided ceramic substrate being configured to electrically isolate a drain of the one or more power semiconductor devices from the external circuit when the surface mount package is joined thereto and being further configured to conduct heat away from the at least one semiconductor device.

18. The surface mount package of claim 17 wherein the POL packaging and interconnect system further comprises a top surface double-sided ceramic substrate applied over the metallization layer, the top surface double-sided ceramic substrate forming the first surface of the surface mount package so as to provide for double-sided cooling of the surface mount package.

19. The surface mount package of claim 17 wherein the POL packaging and interconnect system further comprises a gate connection tab, a source connection tab and a drain connection tab to provide for connection to the external circuit, and wherein the double-sided ceramic substrate and the gate, source and drain connection tabs collectively form the planar second surface of the surface mount package.

* * * * *